United States Patent
Gruber et al.

(12) 
(10) Patent No.: US 6,425,518 B1
(45) Date of Patent: Jul. 30, 2002

(54) METHOD AND APPARATUS FOR APPLYING SOLDER TO AN ELEMENT ON A SUBSTRATE

(75) Inventors: Peter Alfred Gruber, Mohegan Lake; Chon Cheong Lei, Poughkeepsie, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/912,845

(22) Filed: Jul. 25, 2001

(51) Int. Cl.$^7$ ............................................... B23K 31/02
(52) U.S. Cl. ................... 228/256; 228/223; 228/180.21
(58) Field of Search ........................... 228/256, 180.21, 228/56.3, 253, 223, 225, 180.22, 254, 207; 257/735, 736; 438/611, 612

(56) References Cited

U.S. PATENT DOCUMENTS

| | | | |
|---|---|---|---|
| 4,412,642 A | * | 11/1983 | Fisher, Jr. |
| 4,914,814 A | | 4/1990 | Behun et al. |
| 5,244,143 A | | 9/1993 | Ference et al. |
| 5,454,159 A | * | 10/1995 | Norell |
| 5,718,361 A | * | 2/1998 | Braun et al. |
| 6,025,649 A | * | 2/2000 | DiGiacomo |

* cited by examiner

*Primary Examiner*—Tom Dunn
*Assistant Examiner*—Jonathan Johnson
(74) *Attorney, Agent, or Firm*—Ohlandt, Greeley, Ruggiero & Perlr, L.L.P.; Daniel P. Morris

(57) ABSTRACT

There is provided a method for applying solder to an element on a surface of a substrate. The method comprises the steps of (a) placing a mold over the surface, where the mold includes a conduit that contains the solder, and (b) heating the solder to a molten state so that the solder flows from the conduit onto the element. The conduit enjoys two degrees of horizontal freedom with respect to the surface such that the conduit becomes substantially aligned with the element when the solder is in the molten state. There is also provided a system for applying solder to an element on a surface of a substrate.

11 Claims, 2 Drawing Sheets

METHOD AND APPARATUS FOR APPLYING SOLDER TO AN ELEMENT ON A SUBSTRATE

BACKGROUND OF THE INVENTION

1. Field of the Invention

The present invention relates to soldering, and more particularly, to applying solder to an element on a substrate. The technique is particularly suitable for applying solder columns to bottom surface metallurgy (BSM) pads on a chip carrier.

2. Description of the Prior Art

Electronic packaging generally contains many levels of packages and interconnections. A first level package may connect one or more silicon chips on a ceramic substrate carrier. A second level package may interconnect one or more such ceramic substrate carriers on an organic board.

The ceramic substrate is connected to the organic board by pins that are typically rigid and made of metal. The rigid pins are brazed on the ceramic substrate with a suitable braze material such as a gold-tin alloy. Ceramic substrates with an array of such pins, i.e., pin grid arrays (PGA), are subsequently plugged into a pin connector or wave soldered to an array of plated through-holes on the organic board. This connection system has disadvantages such as the through-holes limiting the number of wiring channels available in the board. Another disadvantage is the high cost associated with the braze material, the rigid metal pins, and the pin connectors or plated through-holes.

U.S. Pat. No. 4,914,814 to Behun et al. describes how these disadvantages can be avoided by using solder column connection (SCC) technology, which is also known as ceramic column grid array (CCGA) technology. Generally, CCGA technology is less expensive than PGA technology. CCGA technology also provides an improved electrical interconnection that can better withstand stresses associated with thermal expansion mismatch between a ceramic chip carrier and a supporting circuit board.

To connect a ceramic chip carrier to a supporting circuit board using CCGA technology, the chip carrier is soldered to the board using solder columns, which are typically 90% lead and 10% tin. The solder columns are formed and one end is attached to metallized pads on a surface of the ceramic chip carrier. Such pads are provided by a technique known as bottom surface metallurgy (BSM). Then the other end of the solder columns, opposite to the ceramic chip carrier, is attached to the circuit board.

One problem associated with the CCGA assembly process at the module level occurs when the solder columns do not properly join to the metallized pads of the chip carrier BSM surface. The problem occurs when there is a misalignment between the solder columns and the BSM pads. Pitches of 1.27 mm and 1.00 mm between BSM pads, center to center, are conventionally available. For the 1.00 mm pitch, the BSM pads have a diameter of about 0.8 mm with a spacing of about 0.2 mm between adjacent columns. For the 1.27 mm pitch, the BSM pads have a diameter of about 0.86 mm with a spacing of about 0.41 mm between adjacent BSM pads. As such, the aforementioned problem is more pronounced for the 1.00 mm pitch, but it is also apparent with the 1.27 mm pitch. Defects due to misalignment result in a lower product yield, a loss of material and an increased cost due to rework of the CCGA assembly. Another problem is the formation of excess solder, i.e., solder "blobs", on the chip carrier's BSM surface due to upward force from molten solder during a solder reflow operation.

SUMMARY OF THE INVENTION

It is an object of the present invention to provide an improved method for applying solder to an element on a substrate, such as a BSM pad on a chip carrier.

It is another object of the present invention to provide such a method that reduces possibility of an excess solder "blob" forming between the elements.

It is a further object of the present invention to provide such a method that utilizes a solder surface tension effect to self-center the solder on the element.

These and other objects of the present invention are achieved by a first method for applying solder to an element on a surface of a substrate, comprising (a) placing a mold over the surface, where the mold includes a conduit that contains the solder, and (b) heating the solder to a molten state so that the solder flows from the conduit onto the element. The conduit enjoys two degrees of horizontal freedom with respect to the surface such that the conduit becomes substantially aligned with the element when the solder is in the molten state.

A second method for applying a solder column to an element on a surface of a chip carrier, comprises (a) securing the chip carrier in a fixture, (b) applying a solution having a first flux concentration onto the element, (c) positioning a mold in the fixture over the chip carrier such that a conduit in the mold is in a preliminary alignment with the element, where the conduit contains the solder column, (d) applying a solution having a second flux concentration onto a end of the solder column remote from the element, where the first flux concentration is greater than the second flux concentration, and (e) heating the solder column to a molten state so that the solder column flows from the conduit onto the element. The conduit enjoys two degrees of horizontal freedom with respect to the chip carrier such that the conduit becomes substantially aligned with the element when the solder column is in the molten state.

A first embodiment of the present invention is an apparatus for applying solder to an element on a surface of a substrate. The apparatus comprises (a) a base for holding the substrate, and (b) a mold that includes a conduit for containing the solder, where the mold is placed on the base over the surface. The conduit enjoys two degrees of horizontal freedom with respect to the surface such that the conduit becomes substantially aligned with the element when the solder is in a molten state.

A second embodiment of the present invention is an apparatus for applying a solder column to an element on a surface of a chip carrier, comprising (a) a base for securing the chip carrier, (b) a mold for positioning on the base over the chip carrier, where the mold includes a conduit that contains the solder, and (c) a weight for placement on the mold to limit vertical freedom of the mold with respect to the surface. The conduit enjoys two degrees of horizontal freedom with respect to the chip carrier such that the conduit becomes substantially aligned with the element when the solder column is in a molten state.

DESCRIPTION OF THE INVENTION

The present invention provides for a fixture and method for aligning solder columns with elements on a substrate. The fixture and method are suited for aligning solder columns with bottom surface metallurgy (BSM) input/output (I/O) pads on a chip carrier.

The present invention increases production yield when attaching the solder columns onto the chip carrier. Chip carriers are used as an interconnection between a module and a card or printed circuit board. The fixture allows a mold that contains the solder columns to move freely horizontally along X and Y axes with respect to the chip carrier during solder reflow, and provides a weighted element to restrain undesired vertical movement along the Z axis due to solder surface tension upward forces. More particularly, the invention utilizes the solder surface tension effect to self-center the solder columns with respect to the chip carrier BSM pads along the X and Y axis, and applies a weight for mass balance in the Z axis. This technique significantly reduces cast column rework that would otherwise occur due to misalignment.

Figure 1:
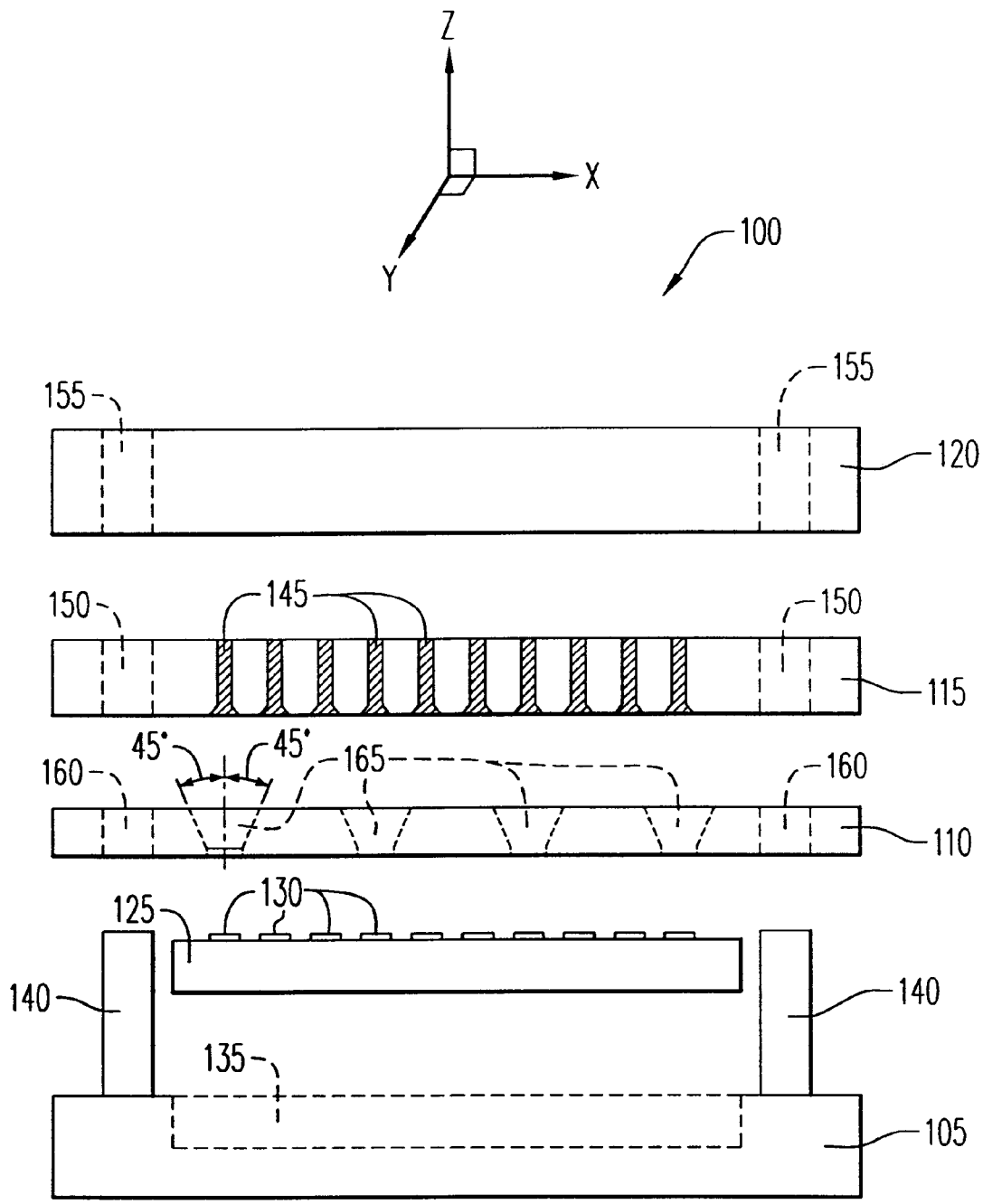
FIG. 1 is an illustration of a fixture, and a pictorial representation of a method, for aligning solder columns with elements on a substrate, in accordance with the present invention.

FIG. 1 is an illustration of a fixture, generally indicated by reference numeral 100, for aligning solder columns with elements on a substrate, in accordance with the present invention. Fixture 100 includes a base 105, an alignment plate 110, a mold 115 and a weight 120.

FIG. 1 also shows a substrate, e.g., chip carrier 125, with a plurality of elements, e.g. BSM pads 130, configured in an array on its top surface. BSM pads 130 are metallic contacts, typically plated with gold and nickel by a metallurgy process. The present invention is described herein in the context of attaching solder columns to a BSM pads 130, however, the solder is not restricted in form to that of a column, and any suitable conductor, such as a wire, or component, such as an integrated circuit, can be soldered to BSM pads 130.

Base 105 has a cavity 135 into which chip carrier 125 is placed. Cavity 135 allows chip carrier 125 to enjoy two degrees of horizontal freedom, that is, along an X axis and along a Y axis, over a limited spatial range. Base 105 also includes alignment pins 140. Preferably base 105 is made of graphite, and alignment pins 140 are made of stainless steel.

Mold 115 includes a plurality of channels or conduits 145 that contain the solder that will eventually be applied to the BSM pads 130. Conduits 145 are configured in an array such that each of conduits 145 correspond with, and ultimately will align with, one of the plurality of BSM pads 130. The solder is preferably a mix of 90% lead and 10% tin. It can be installed into conduits 145 by any conventional process, however the preferred installation techniques are either of an injection molding process or a mechanical vibration and vacuum process. In the injection molding process, injection molded solder (IMS) is injected, while in a molten state, into conduits 145. In the mechanical vibration and vacuum process, also known as a pin load, pre-cut solder segments or solder wires are loaded into conduits 145.

Mold 115 is placed over or on top of chip carrier 125. It has alignment holes 150 that mate with alignment pins 140 of base 105 and help to ensure the alignment of conduits 145 and BSM pads 130. Alignment holes 150 have a diameter that is approximately 0.014 to 0.018 inch larger than the diameter of alignment pins 140. Thus, mold 115, and accordingly, channels 145, is allowed a limited degree of horizontal freedom along the X and Y axes. This freedom also allows molten solder from conduits 145 to move freely in the X and Y axes with respect to BSM pads 130 during furnace reflow of the solder. Mold 115 is preferably made of graphite Weight 120 has alignment holes 155 that mate with alignment pins 140 of base 105. It is placed on top of mold 115 and applies a downward force on mold 115 and restrains vertical movement of mold 115, i.e., along the Z axis.

Alignment plate 110 is a template that is temporarily placed on top of chip carrier 125 when chip carrier 125 is in cavity 135, to facilitate a preliminary alignment of BSM pads 130 of chip carrier 125 with conduits 145 of mold 115. Alignment plate 110 has several apertures 165 that allow a user of fixture 100 to visually inspect the orientation of chip carrier 125 within cavity 135. The spacing between the centerlines of apertures 165 relative to alignment holes 160 is the same as the spacing between the centerlines of corresponding conduits 145 relative to alignment holes 150.

During the preliminary alignment, the user places one end of apertures 165 adjacent to BSM pads 130, and views BSM pads 130 through the other end of apertures 165. The user typically performs the visual inspection with the aid of a microscope or other suitable magnifying device. Apertures 165 are slightly larger than BSM pads 130, and preferably slope out to have a larger dimension on the side through which the user is looking than on the side adjacent to BSM pads 130. For example, as shown in FIG. 1, apertures 165 may have side walls that slope out at an angle of about 45 degrees from a vertical axis. The sloped side walls permit for easier viewing of the relationship between BSM pads 130 and the end of apertures 165 adjacent thereto. The user performs the preliminary alignment by adjusting the position of chip carrier 130 within cavity 135 for a best fit between apertures 165 and BSM pads 130. After completion of the preliminary alignment, alignment plate 110 is removed from base 105, and chip carrier 125 is secured in its pre-aligned position.

Figure 2:
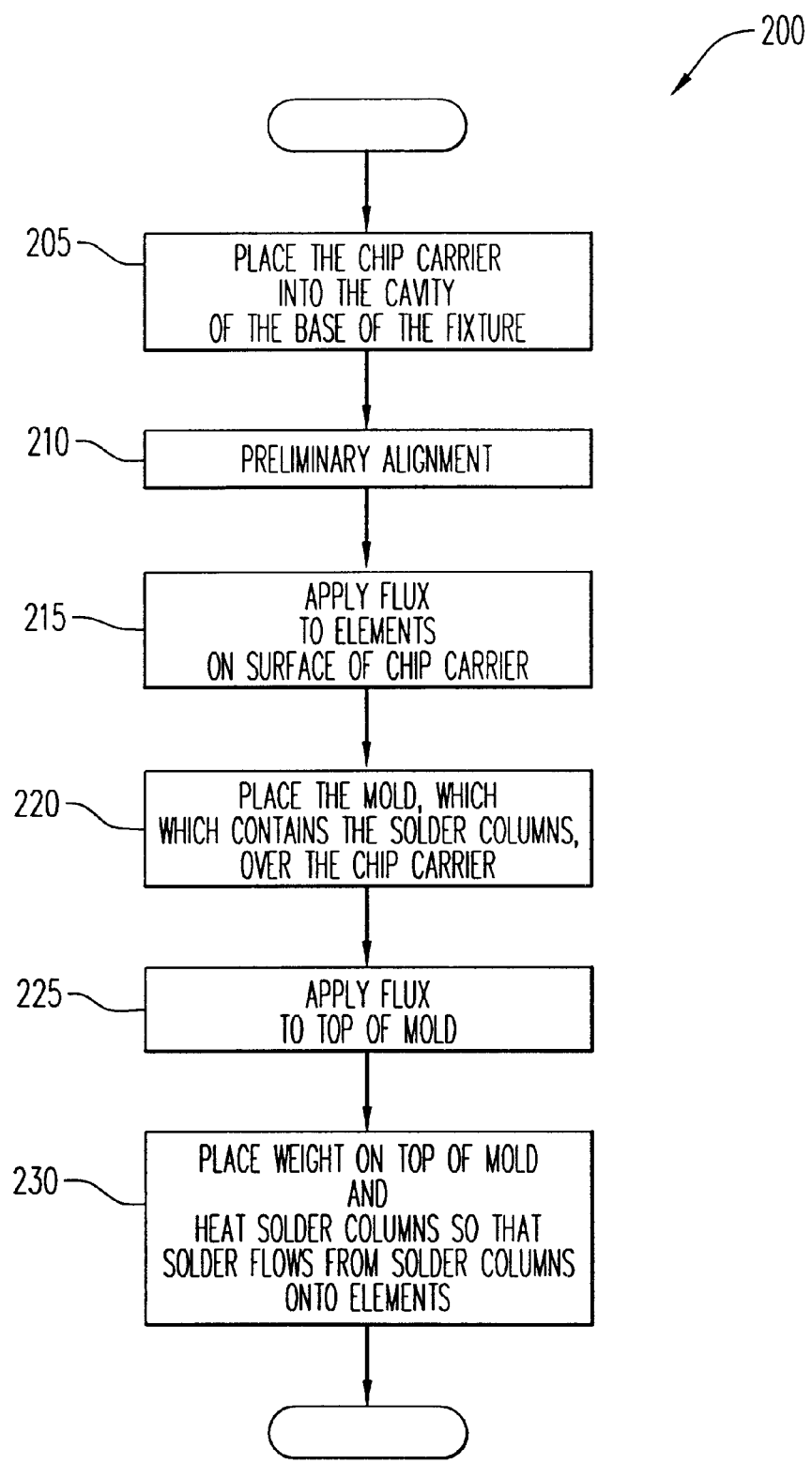
FIG. 2 is a flowchart of a method for applying solder to an element on a surface of a substrate, in accordance with the present invention.

FIG. 2 is a flowchart of a method 200 for applying solder to an element on a surface of a substrate, in accordance with the present invention. Method 200 is described below with reference to the elements of FIG. 1, in the context of aligning solder columns with BSM pads. Method begins with step 205.

In step 205, chip carrier 125 is placed within cavity 135 of base 105. Method 200 then progresses to step 210.

In step 210, alignment plate 110 is placed on top of chip carrier 125 and chip carrier 125 is preliminarily aligned within cavity 135. The preliminary alignment more specifically refers to a desired alignment relationship between BSM pads 130 and conduits 145 when mold 115 is placed over chip carrier 125 (see step 220, below). Alignment plate 110 has several apertures 165 to permit a visual inspection of the relationship between apertures 165 of alignment plate 110 and BSM pads 130. Upon completion of this preliminary alignment, alignment plate 110 is removed and chip carrier 125 is secured in its pre-aligned position within base 105, by way of a set screw or other conventional locking arrangement. If the solder surface tension self-centering effect is sufficient to yield a satisfactory alignment between conduits 145 and BSM pads 130, then step 210 is not required. Method 200 then progresses to step 215.

In step 215, a flux solution is applied to the surface of BSM pads 130 to remove oxides therefrom. The flux solution preferably has a flux concentration of about 8% to 12% rosin-based in an organic solvent, such as iso-propyl-alcohol (IPA). Method 200 then progresses to step 220.

In step 220, mold 115, which contains the solder columns in conduits 145, is placed over chip carrier 125. Alignment holes 150 mate with alignment pins 140. Because of the preliminary alignment performed during step 210, the solder columns are substantially aligned with BSM pads 130. Method 200 then progresses to step 225.

In step 225, a flux solution is applied to the top surface of mold 115, and more specifically, to the end of the solder columns opposite of, or remote from, BSM pads 130, to create a localized reducing atmosphere. The flux solution preferably has a flux concentration of about 2% to 6% rosin-based in an organic solvent, such as IPA. Note that the flux concentration on the surface of BSM pads 130 (see step 215) is greater than that applied to the surface of mold 115 (in the current step) because solder flows to an area of higher flux concentration, and in this case, the solder is intended to flow toward BSM pads 130. After completion of step 225, method 200 progresses to step 230.

In step 230, weight 120 is placed on top of mold 115. Weight 120 counteracts an upward force from molten solder that ordinarily occurs during a solder reflow operation. It reduces the possibility that solder column will join together as "blobs" during reflow. Weight 120 is selected as an optimized mass balance along the Z axis. If weight 120 is too heavy, then it will unduly restrict the movement of mold 115 along the X and Y axes, and consequently, when the solder is in its molten state, the self-centering effect of the solder surface tension will be ineffective. If weight 120 is too light, then it will not adequately restrain the aforementioned vertical force to prevent solder "blobs". Table 1 lists several different chip carrier configurations, and weights that are considered practical for those configurations.

TABLE 1

| BSM Pad Pitch (mm) | BSM Pad Count | Weight (grams) Pin Load Process | Weight (grams) IMS Process |
|---|---|---|---|
| 1.27 | 624 | 15 to 20 | 16 to 22 |
| 1.27 | 831 | 50 to 58 | 55 to 64 |
| 1.27 | 1088 | 62 to 70 | 68 to 77 |
| 1.00 | 1247 | 66 to 74 | 72 to 81 |
| 1.00 | 1657 | 88 to 94 | 96 to 103 |

Note that the optimized weights for weight 120 depend, in part, on whether the solder columns were installed into conduits 145 of mold 115 by the pin load process or by the IMS process. For example, given a BSM pad pitch of 1.00 mm and a BSM pad count of 1657, a weight of 88 to 94 grams is appropriate for the pin load process, whereas 96 to 103 grams is appropriate for the IMS process. This is due, in part, to the fact that in the IMS process the solder is installed in a molten state into conduits 145, and thus conduits 145 are substantially, completely filled with solder. In contrast, in the pin load process, the solder is installed in a solid state in the form of solder segments or solder wires, and thus conduits 145 typically are not completely filled with solder. Because of this difference in the quantity of solder in conduits 145, a greater weight, approximately 10% on average, is suggested for use if conduits 145 were loaded using the IMS process as compared to being loaded using the pin load process.

Also in step 230, assembly 100 is heated, for example in a furnace, to transform the solder columns in conduits 145 to a molten state. The molten solder flows from conduits 145 to BSM pads 130, thus resulting in the formation of a cast solder columns at each of BSM pads 130. Because of the surface tension of reflowed solder and because of the loose fit between alignment holes 105 of mold 115 and alignment pins 140 of base 105, the molten solder from conduits 145 moves with relative freedom in the X and Y directions, and self-centers the solder column with BSM pads 130. Note that if the solder surface tension self-centering effect is adequate to achieve a desired level of column alignment on its own, then the preliminary adjustment in step 210 is not required.

It should be understood that various alternatives and modifications can be devised by those skilled in the art. For example, although the present invention is described in the context of applying solder columns to BSM pads on a chip carrier, it is also suitable for applying solder to other types of surface elements, such as pads on a printed circuit board or contacts on a surface-mount component. The present invention is intended to embrace all such alternatives, modifications and variances that fall within the scope of the appended claims.

What is claimed is:

1. A method for applying solder to an element on a surface of a substrate, comprising:

placing a mold over said surface, wherein said mold includes a conduit that contains said solder; and heating said solder to a molten state so that said solder flows from said conduit onto said element, wherein before the heating, applying a solution having a first flux concentration onto said element; and applying a solution having a second flux concentration onto an end of said solder column remote from said element, wherein said first flux concentration is greater than said second flux concentration, wherein said conduit enjoys two degrees of horizontal freedom with respect to said surface such that said conduit becomes substantially aligned with said element when said solder is in said molten state.

2. The method of claim 1, further comprising, before said placing, holding said substrate in a fixture, wherein said placing comprises positioning said mold in said fixture such that said conduit is in a preliminary alignment with said element.

3. The method of claim 2, further comprising, before said holding, using a template to position said substrate in said fixture to facilitate said preliminary alignment.

4. The method of claim 1, further comprising, before said heating, placing a weight on said mold to limit vertical freedom of said mold with respect to said surface.

5. The method of claim 1, further comprising, prior to said placing, installing said solder into said conduit by injection molding.

6. The method of claim 1, further comprising, prior to said placing, installing said solder into said conduit as a pin load.

7. The method of claim 1, wherein said solder comprises a solder column, wherein said element comprises a bottom surface metallurgy (BSM) pad, and wherein said substrate comprises a chip carrier.

8. A method for applying a solder column to an element on a surface of a chip carrier, comprising:

securing said chip carrier in a fixture;

applying a solution having a first flux concentration onto said element;

positioning a mold in said fixture over said chip carrier such that a conduit in said mold is in a preliminary alignment with said element, wherein said conduit contains said solder column;

applying a solution having a second flux concentration onto a end of said solder column remote from said element, wherein said first flux concentration is greater than said second flux concentration; and heating said solder column to a molten state so that said solder column flows from said conduit onto said element, wherein said conduit enjoys two degrees of horizontal freedom with respect to said chip carrier such that said conduit becomes substantially aligned with said element when said solder column is in said molten state.

9. The method of claim 8, further comprising, before said securing, using a template to position said chip carrier in said fixture to facilitate said preliminary alignment.

10. The method of claim 8, further comprising, before said heating, placing a weight on said mold to limit vertical freedom of said mold with respect to said chip carrier.

11. The method of claim 8, wherein said element is a bottom surface metallurgy (BSM) pad.

* * * * *